US011092731B2

United States Patent
Imada et al.

(10) Patent No.: US 11,092,731 B2
(45) Date of Patent: Aug. 17, 2021

(54) LIGHT EMITTING MODULE AND PLANAR LIGHT SOURCE HAVING A LIGHT GUIDE WITH CAVITY AND FLOURESCENT MATERIAL DISPOSED ON A SURFACE OF CAVITY AND LIGHT GUIDE

(71) Applicant: NICHIA CORPORATION, Anan (JP)

(72) Inventors: Mamoru Imada, Anan (JP); Yusaku Achi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/940,536

(22) Filed: Jul. 28, 2020

(65) Prior Publication Data

US 2020/0355863 A1    Nov. 12, 2020

Related U.S. Application Data

(63) Continuation of application No. 16/428,387, filed on May 31, 2019, now Pat. No. 10,739,507.

(30) Foreign Application Priority Data

May 31, 2018 (JP) .............................. JP2018-104782

(51) Int. Cl.
*F21V 8/00* (2006.01)
(52) U.S. Cl.
CPC ........... *G02B 6/002* (2013.01); *G02B 6/0025* (2013.01); *G02B 6/0026* (2013.01); *G02B 6/0055* (2013.01)
(58) Field of Classification Search
CPC ............... F21Y 2115/10; G02B 6/0026; G02F 1/133603; G02F 1/133602; H01L 33/08
See application file for complete search history.

(56) References Cited

U.S. PATENT DOCUMENTS

| | | | |
|---|---|---|---|
| 6,250,767 B1 | 6/2001 | Kusafuka et al. | |
| 7,142,769 B2 | 11/2006 | Hsieh et al. | |
| 7,378,792 B2 * | 5/2008 | Huang ................... | G02B 1/005 313/512 |
| 9,557,601 B2 | 1/2017 | Gu et al. | |

(Continued)

FOREIGN PATENT DOCUMENTS

| | | |
|---|---|---|
| CN | 107656398 A | 2/2018 |
| JP | 2000009942 A | 1/2000 |

(Continued)

OTHER PUBLICATIONS

United States Patent and Trademark Office, Notice of Allowance issued to U.S. Appl. No. 16/428,387 dated Apr. 6, 2020, 5 pages.

(Continued)

*Primary Examiner* — Robert J May
(74) *Attorney, Agent, or Firm* — Hunton Andrews Kurth LLP

(57) ABSTRACT

A light emitting module and a planar light source reduced in thickness are provided. A light emitting module includes: a light guide plate including a first main surface serving as a light emitting surface, a second main surface provided on a side opposite to the first main surface, and a recess provided at the second main surface; a first fluorescent material layer provided in the recess; a light emitting element provided at the first fluorescent material layer on the second main surface side; and a second fluorescent material layer provided at the second main surface.

11 Claims, 9 Drawing Sheets

(56) References Cited

U.S. PATENT DOCUMENTS

| | | | |
|---|---|---|---|
| 9,903,559 B2 | 2/2018 | Hsu | |
| 9,997,674 B2 | 6/2018 | Butterworth et al. | |
| 2009/0273931 A1* | 11/2009 | Ito | G02B 6/0018 362/267 |
| 2010/0277950 A1 | 11/2010 | Shchekin et al. | |
| 2012/0293979 A1 | 11/2012 | Zhang | |
| 2014/0211449 A1 | 7/2014 | Nomura et al. | |
| 2018/0045384 A1 | 2/2018 | Uno | |
| 2018/0239193 A1 | 8/2018 | Hayashi | |

FOREIGN PATENT DOCUMENTS

| | | |
|---|---|---|
| JP | 2007214076 A | 8/2007 |
| JP | 2011142079 A | 7/2011 |
| JP | 2012525674 A | 10/2012 |
| JP | 2014146750 A | 8/2014 |
| JP | 2018133304 A | 8/2018 |
| WO | 2012141094 A1 | 10/2012 |
| WO | 2016158371 A1 | 10/2016 |

OTHER PUBLICATIONS

United States Patent and Trademark Office, Non-Final Office Action issued to U.S. Appl. No. 16/428,387 dated Dec. 18, 2019, 6 pages.

\* cited by examiner

LIGHT EMITTING MODULE AND PLANAR LIGHT SOURCE HAVING A LIGHT GUIDE WITH CAVITY AND FLOURESCENT MATERIAL DISPOSED ON A SURFACE OF CAVITY AND LIGHT GUIDE

CROSS-REFERENCE TO RELATED PATENT APPLICATION

This is a continuation application of U.S. patent application Ser. No. 16/428,387, filed May 31, 2019, which claims priority under 35 U.S.C. § 119 to Japanese Patent Application No. 2018-104782, filed on May 31, 2018. The contents of this application are incorporated herein by reference in their entirety.

BACKGROUND

1. Technical Field

The present disclosure relates to a light emitting module and a planar light source.

2. Description of Related Art

A Light emitting module using a light emitting element such as a light emitting diode is widely used, for example, as a planar light source for backlight for a liquid crystal display. For example, as to a direct backlight-type liquid crystal display having a planar light source disposed on the back surface of the liquid crystal panel, there exists great demand for a thinner planar light source (see JP 2014-146750 A).

SUMMARY

The present disclosure provides a light emitting module and a planar light source reduced in thickness.

An embodiment of the present disclosure provides a light emitting module including: a light guide plate including a first main surface serving as a light emitting surface, a second main surface provided on a side opposite to the first main surface, and a recess provided at the second main surface; a first fluorescent material layer provided in the recess; a light emitting element provided at the first fluorescent material layer on the second main surface side; and a second fluorescent material layer provided at the second main surface.

The present disclosure provides a light emitting module and a planar light source reduced in thickness.

DETAILED DESCRIPTION OF EMBODIMENTS

Figure 1:
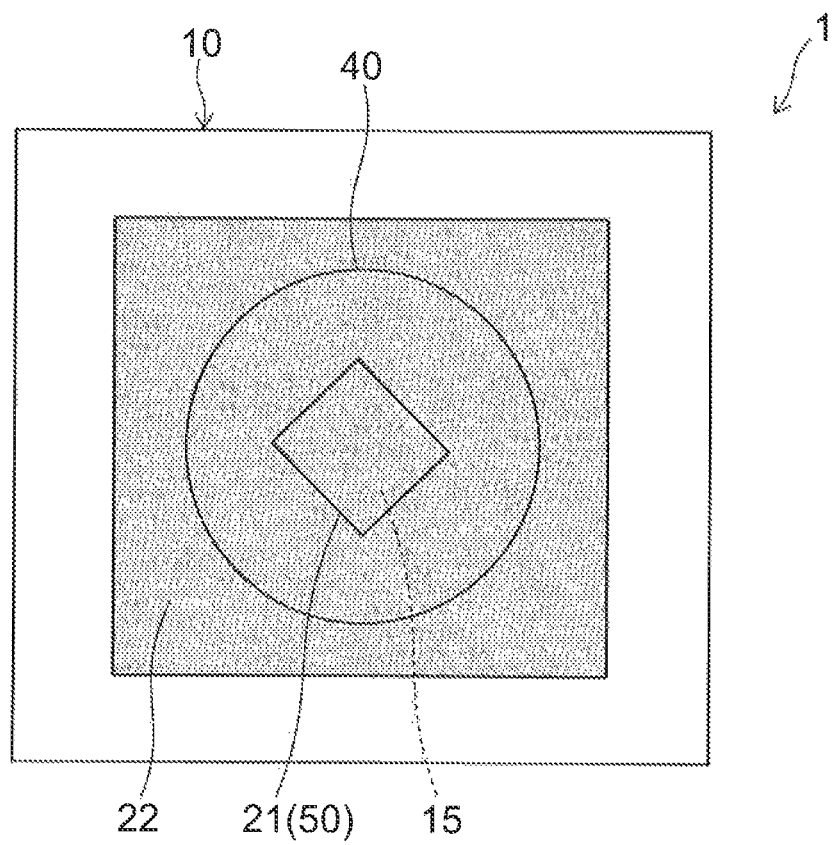
FIG. 1 is a schematic top view of a light emitting module according to an embodiment of the present disclosure.

In the following, with reference to the drawings, a description will be given of embodiments. Note that, throughout the drawings, an identical element is denoted by an identical reference character.

FIG. 1 is a schematic top view of a light emitting module 1 according to an embodiment.

Figure 2:
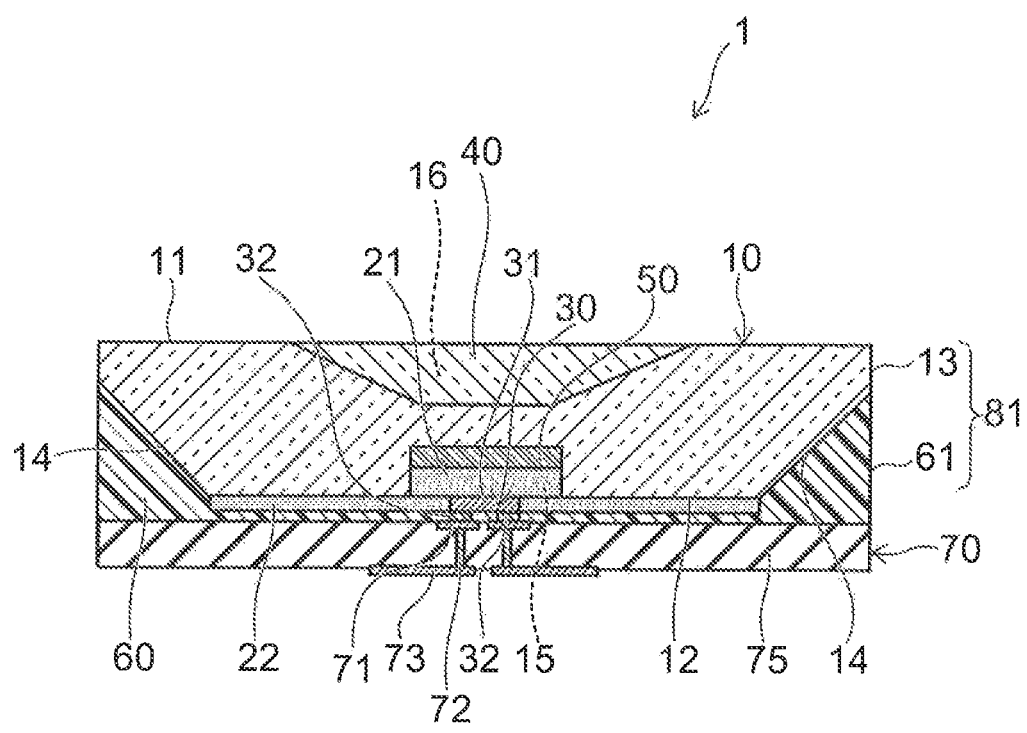
FIG. 2 is a schematic cross-sectional view of the light emitting module according to the embodiment.

FIG. 2 is a schematic cross-sectional view of the light emitting module 1.

The light emitting module 1 includes a light guide plate 10, a light emitting element 30, and fluorescent material layers 21, 22.

The light guide plate 10 transmits light emitted by the light emitting element 30, and light emitted by a fluorescent material contained in the fluorescent material layers 21, 22. When the light becomes incident on the light guide plate 10, the light guide plate 10 emits light from a first main surface 11 in a planar manner.

The material of the light guide plate 10 may be, for example, thermoplastic resin such as acrylic, polycarbonate, cyclic polyolefin, polyethylene terephthalate, or polyester, thermosetting resin such as epoxy or silicone, or glass. Among others, polycarbonate which is highly light transmissive and inexpensive is preferable.

The light guide plate 10 includes the first main surface 11 which is the light emitting surface, a second main surface 12 on the side opposite to the first main surface 11, and a recess 15 provided at the second main surface 12. The light guide plate 10 further includes a lateral surface which is continuous to the first main surface 11. The lateral surface of the light guide plate 10 forms a lateral surface 81 of the light emitting module 1.

The recess 15 includes a first fluorescent material layer 21. The light emitting element 30 is provided at the first fluorescent material layer 21 of the light guide plate 10 on the second main surface 12 side. The recess 15 functions to position the light emitting element 30 relative to the light guide plate 10.

The light emitting element 30 includes a main light emitting surface 31 from which light is mainly extracted, and a positive and negative pair of electrodes 32 provided at the side opposite to the main light emitting surface 31. The light emitting element 30 includes a light-transmissive substrate composed of, for example, sapphire, and a semiconductor layered structure layered on the light-transmissive substrate. The semiconductor layered structure includes, for example, $In_xAl_yGa_{1-x-y}N$ (0≤x, 0≤y, X+Y≤1), and emits blue-color light.

The main light emitting surface 31 of the light emitting element 30 may be bonded to the first fluorescent material layer 21 with, for example, a light-transmissive adhesive agent. The lateral surface and the electrodes 32 of the light emitting element 30 are positioned outside the recess 15.

In the example shown in FIG. 1, the first fluorescent material layer 21 is formed in a quadrangular shape as seen in a plan view. The quadrangular first fluorescent material layer 21 is disposed as being rotated by 45 degrees relative to the quadrangular light guide plate 10. When the first fluorescent material layer 21 is quadrangular as seen in a plan view, light emitted from the lateral surfaces of the first fluorescent material layer 21 tends to be higher in luminance at the sides of the lateral surfaces than in the diagonal directions of the quadrangular first fluorescent material layer 21. Therefore, by the lateral surfaces of the first fluorescent material layer 21 opposing to the corners of the light guide plate 10, and the corners of the first fluorescent material layer 21 opposing to the lateral surfaces of the light guide plate 10, even luminance and color are attained in the surface direction of the light emitting module.

The first fluorescent material layer 21 includes a base material, and a fluorescent material dispersed in the base material. The material of the base material of the first fluorescent material layer 21 may be, for example, epoxy resin, silicone resin, or glass. In view of light resistance and moldability, the base material is preferably silicone resin.

The fluorescent material is excited by light emitted by the light emitting element 30, to emit light of which wavelength is different from the light emitted by the light emitting element 30. For example, the fluorescent material may be a YAG fluorescent material, a β-sialon fluorescent material, a KSF-based fluorescent material or the like.

For example, for the light emitting element 30 emitting light in blue-based color, the first fluorescent material layer 21 containing a YAG fluorescent material emitting light in yellow-based color may be used. The first fluorescent material layer 21 may contain a plurality of types of fluorescent materials. For example, using a first fluorescent material layer 21 which contains a β-sialon fluorescent material emitting light in greenish color and a KSF-based fluorescent material emitting light in reddish color for the light emitting element 30 emitting light in bluish color, the color reproduction range of the light emitting module 1 increases.

At the second main surface 12 of the light guide plate 10, a second fluorescent material layer 22 is provided. The material of the second fluorescent material layer 22 and the material of the first fluorescent material layer 21 may be identical. On the second fluorescent material layer 22 provided at the second main surface 12 of the light guide plate 10, light emitted from the lateral surface of the light emitting element 30 becomes incident. In view of improving the efficiency of light emitted from the lateral surface of the light emitting element 30 becoming incident on the second fluorescent material layer 22, the second fluorescent material layer 22 is preferably in contact with the lateral surface of the light emitting element 30.

At the first main surface 11 of the light guide plate 10, a recess 16 is provided. In the recess 16, an optical function part 40 is provided. The optical function part 40 is provided at a position opposing to the recess 15 formed at the second main surface 12. That is, the optical function part 40 is provided at the position opposing to the first fluorescent material layer 21 provided in the recess 15 and to the light emitting element 30 positioned relative to the recess 15. The optical axis of the light emitting element 30 and the optical axis of the optical function part 40 preferably substantially coincide with each other. The shape of the recess 16 is, for example, an inverted polygonal pyramid such as an inverted cone, an inverted pyramid, or an inverted hexagonal pyramid. Alternatively, the shape of the recess 16 may be an inverted truncated cone, or an inverted polygonal truncated pyramid.

The optical function part 40 may comprise light-transmissive resin, glass, or air. The refractive index of the optical function part 40 is lower than that of the light guide plate 10. The optical function part 40 is capable of functioning as a lens that refracts light at the interface between the light guide plate 10 and the optical function part 40 to spread the light in the surface direction of the light guide plate 10.

At the upper surface of the first fluorescent material layer 21, a light scattering layer 50 containing a light scattering agent is provided. The light scattering layer 50 scatters part of light emitted regularly upward from the light emitting element 30, thereby returning the light downward. This minimizes an excessive increase in luminance immediately above the light emitting element 30 than other part, in the first main surface 11 of the light guide plate 10 which is the light emitting surface of the light emitting module 1.

The light guide plate 10 includes an inclined surface 14 which forms an obtuse angle relative to the second main surface 12 and is continuous to the second main surface 12. The inclined surface 14 and the second fluorescent material layer 22 are covered with a light-reflective resin layer 60.

The light-reflective resin layer 60 reflects light emitted by the light emitting element 30, light emitted by the first fluorescent material layer 21, and light emitted by the second fluorescent material layer 22. For example, the light-reflective resin layer 60 may include resin containing white-color pigment or the like. In particular, the light-reflective resin layer 60 is preferably silicone resin containing titanium oxide.

In the lateral surface 81 of the light emitting module 1, the side on the first main surface 11 of the light guide plate 10 is a light-transmissive part 13 which is part of the light guide plate 10. The lateral surface 81 of the light emitting module 1 further includes a light-reflective part 61 formed by the light-reflective resin layer 60. The light-reflective part 61 is nearer to the second main surface 12 than the light-transmissive part 13 is.

The electrodes 32 of the light emitting element 30 are bonded to a wiring 71. The light-reflective resin layer 60 is insulating, and covers the lateral surface of the electrodes 32 of the light emitting element 30.

The light-reflective resin layer 60 is bonded to a wiring board 70. The wiring board 70 includes an insulating base member 75, a wiring 73 provided on the back side of the base member 75, and a via 72 penetrating through the base member 75. The via 72 connects between the wiring 71 and the wiring 73. The electrodes 32 of the light emitting element 30 are electrically connected to the wiring 73 through the wiring 71 and the via 72.

The base member 75 of the wiring board 70 may be formed of, for example, resin, ceramic or the like. The wirings 71, 73 and the via 72 may be formed of, for example, copper.

FIGS. 3A to 3D are schematic cross-sectional views for describing a method of manufacturing the light emitting module 1.

Figure 3A:
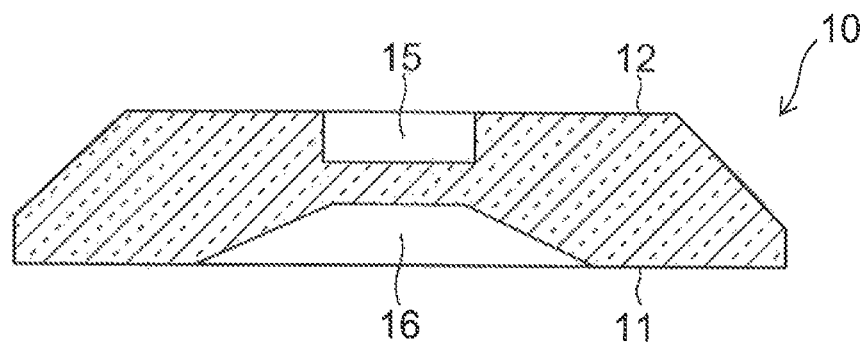
FIG. 3A is a schematic cross-sectional view for describing a method of manufacturing the light emitting module according to the embodiment.

Firstly, as shown in FIG. 3A, the light guide plate 10 is provided.

The light guide plate 10 may be molded by, for example, injection molding, transfer molding, or thermal-transfer printing. Collectively molding the recess 16 where the optical function part 40 is provided and the recess 15 where the first fluorescent material layer 21 is provided and which also functions to position the light emitting element 30 using a molding assembly improves the alignment between the optical function part 40 and the light emitting element 30.

Figure 3B:
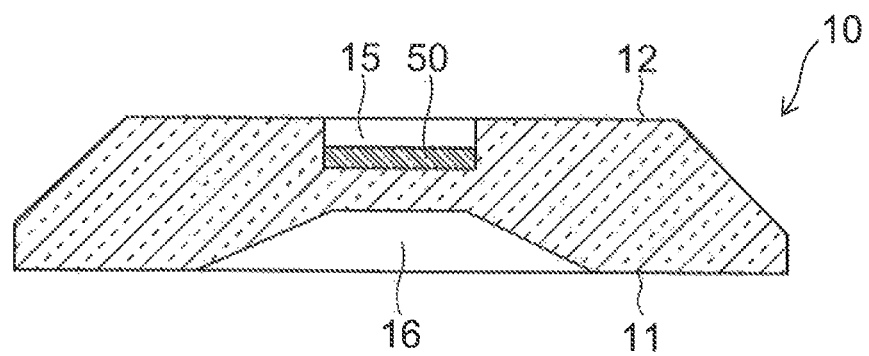
FIG. 3B is a schematic cross-sectional view for describing the method of manufacturing the light emitting module according to the embodiment.

As shown in FIG. 3B, at the bottom surface of the recess 15, the light scattering layer 50 is provided. The light scattering layer 50 can be formed by, for example, potting, printing, or spraying.

Figure 3C:
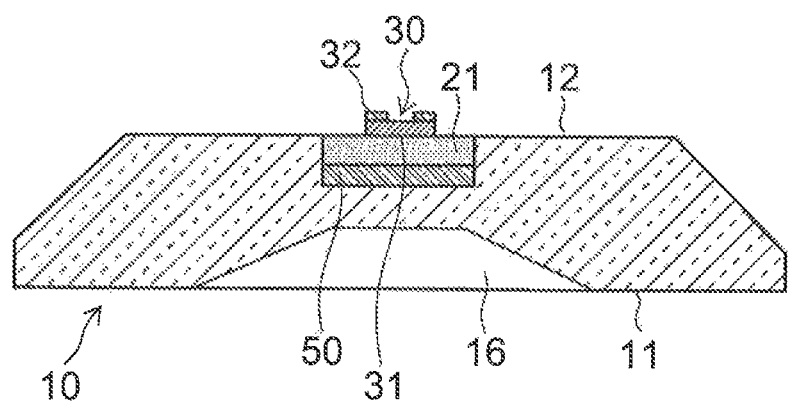
FIG. 3C is a schematic cross-sectional view for describing the method of manufacturing the light emitting module according to the embodiment.

As shown in FIG. 3C, on the light scattering layer 50 in the recess 15, the first fluorescent material layer 21 is provided. On the first fluorescent material layer 21, the light emitting element 30 is disposed. The main light emitting surface 31 of the light emitting element 30 is bonded to the first fluorescent material layer 21.

Figure 3D:
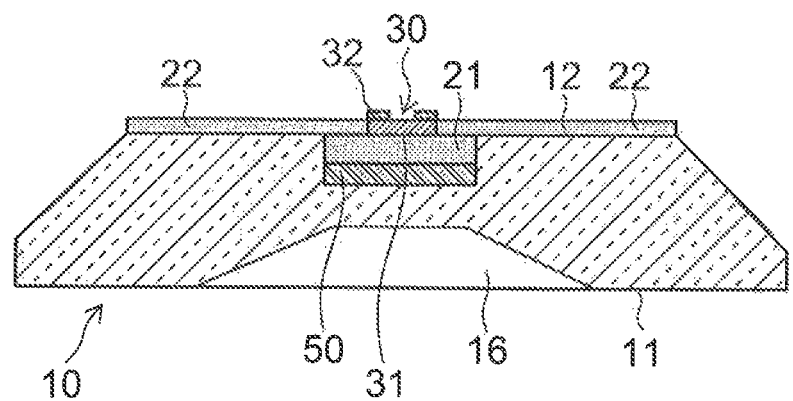
FIG. 3D is a schematic cross-sectional view for describing the method of manufacturing the light emitting module according to the embodiment.

As shown in FIG. 3D, at the second main surface 12 of the light guide plate 10, the second fluorescent material layer 22 is provided. The first fluorescent material layer 21 and the second fluorescent material layer 22 can be formed by, for example, potting, printing, or spraying.

Alternatively, after the second fluorescent material layer 22 is formed at the second main surface of the light guide plate 10, the light emitting element 30 may be bonded to the first fluorescent material layer 21. In this case, the second fluorescent material layer 22 is patterned, to form an opening above the first fluorescent material layer 21. Inside the opening, the light emitting element 30 is disposed.

Thereafter, the optical function part 40 shown in FIG. 2 may be provided in the recess 16 of the light guide plate 10 on the first main surface 11 side. The light-reflective resin layer 60 is provided to cover the inclined surface 14 of the light guide plate 10 and the second fluorescent material layer 22.

The wiring 71 is formed at the surface of the light-reflective resin layer 60. The wiring 71 is bonded to the electrodes 32 of the light emitting element 30. Thereafter, the wiring board 70 is bonded to the light-reflective resin layer 60. Here, the wiring 71 and the via 72 are bonded to each other by a conductive material filling up the via 72 being molten by pressurizing and heating. This eliminates a high-temperature process such as reflow soldering. Thus, a thermoplastic material which hardly withstands heat such as polycarbonate can be employed as the light guide plate 10.

In the light emitting module 1 according to the embodiment, the light emitting element 30 is mounted on the light guide plate 10. This reduces the distance between the light guide plate 10 and the light emitting element 30, thereby reducing the thickness of the light emitting module 1.

The first fluorescent material layer 21 and the second fluorescent material layer 22 are provided not at the first main surface 11 which is the light emitting surface of the light guide plate 10, but at the second main surface 12 opposite to the first main surface 11. Therefore, light having its wavelength converted by the first fluorescent material layer 21 and the second fluorescent material layer 22 diffuses in the surface direction by the light guide plate 10 and the optical function part 40, minimizing any color unevenness in the surface of the light guide plate 10.

When there is provided just the first fluorescent material layer 21 on the main light emitting surface 31 of the light emitting element 30, particularly when the plane size of the light guide plate 10 is great, the color of light emitted by the first fluorescent material layer 21 (for example, yellow) tends to be strong around the center of the light emitting surface (the first main surface 11), and the color of light emitted by the light emitting element 30 (for example, blue) tends to be strong along the periphery.

In the embodiment, the second fluorescent material layer 22 is provided at the second main surface 12 of the light guide plate 10. This secures a wide fluorescent material region (the wavelength conversion region) for receiving light emitted from the lateral surface of the light emitting element 30, and light emitted by the fluorescent material and the light emitted by the light emitting element 30 are distributed by a proper ratio over the entire surface of the light guide plate 10. This minimizes any color unevenness in the surface of the light guide plate 10.

The light emitting module 1 according to the embodiment can be used as, for example, backlight of a liquid crystal display. For example, with a direct backlight-type liquid crystal display in which backlight is disposed on the back surface of the liquid crystal panel, since the distance between the liquid crystal panel and the light emitting module 1 is small, the color unevenness in the light emitting module 1 tends to influence the color unevenness of the liquid crystal display. Here, use of the light emitting module 1 according to the embodiment with minimum color unevenness as backlight of the direct backlight-type liquid crystal display minimizes color unevenness of the liquid crystal display.

The second fluorescent material layer 22 being provided over the entire second main surface 12 of the light guide plate 10 contributes to achieving color evenness of light in the surface.

Alternatively, in view of reducing costs by reducing the use amount of the material of the fluorescent material, the second fluorescent material layer 22 may be provided partially at the second main surface 12.

Figure 4:
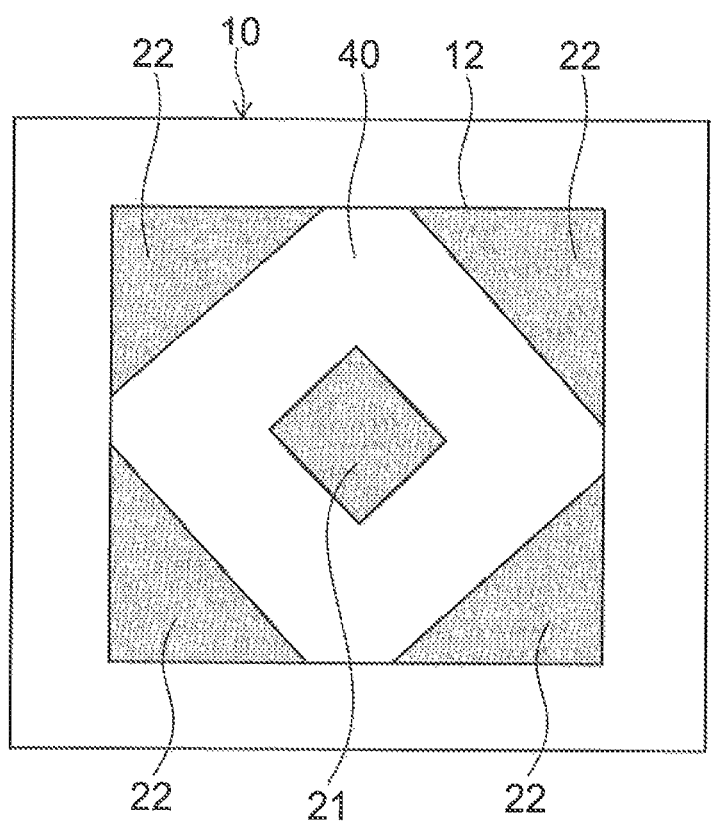
FIG. 4 is a schematic plan view showing an exemplary disposition pattern of a fluorescent material layer in the light emitting module according to the embodiment.
Figure 5:
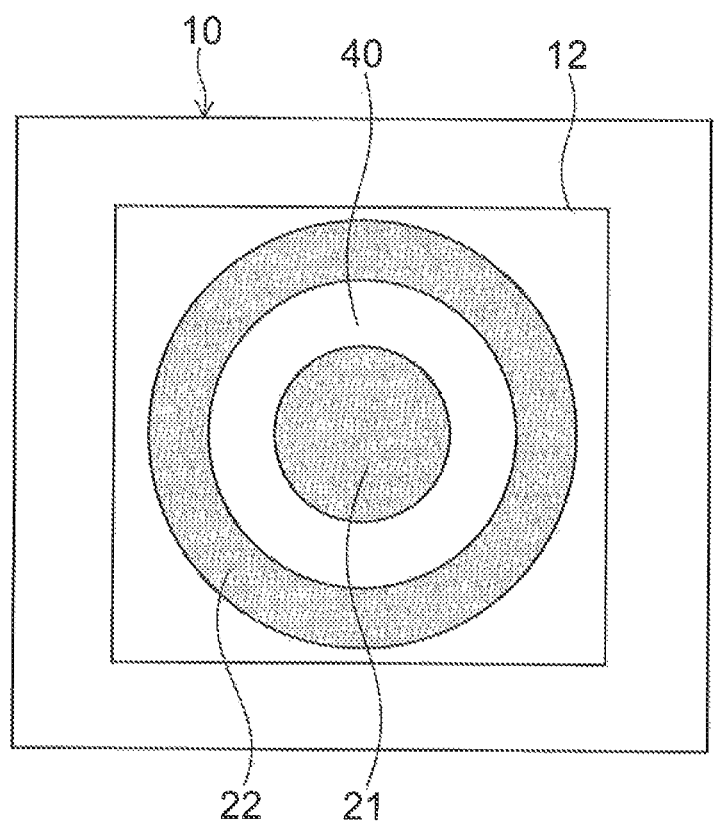
FIG. 5 is a schematic plan view showing an exemplary disposition pattern of the fluorescent material layer according to the embodiment.

FIGS. 4 and 5 are schematic plan views showing an exemplary disposition pattern of the second fluorescent material layer 22 partially provided at the second main surface 12.

In the example shown in FIG. 4, the first fluorescent material layer 21 is formed in a quadrangular shape as seen in a plan view, and the second main surface 12 of the light guide plate 10 is also formed in a quadrangular shape. The second fluorescent material layer 22 is provided at the four corners of the second main surface 12 and evenly disposed around the first fluorescent material layer 21. This minimizes color unevenness in the surface of the light guide plate 10.

In the example shown in FIG. 5, the first fluorescent material layer 21 is formed in a circular shape as seen in a plan view, and the second main surface 12 of the light guide plate 10 is formed in a quadrangular shape. The second fluorescent material layer 22 is evenly disposed annularly around the first fluorescent material layer 21. This minimizes color unevenness in the surface of the light guide plate 10.

Figure 6:
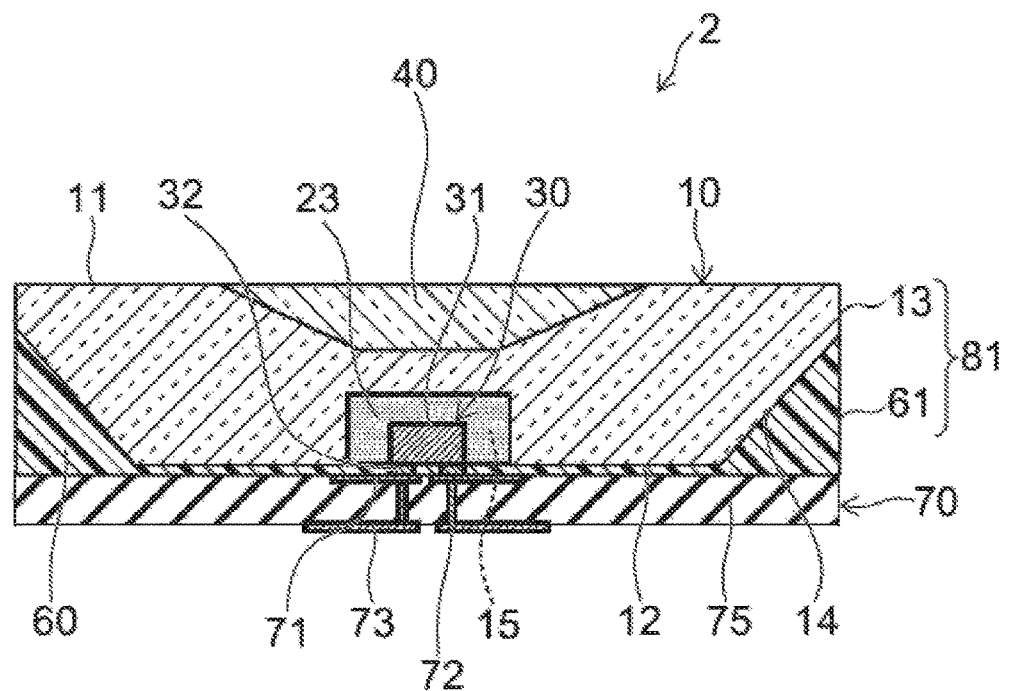
FIG. 6 is a schematic cross-sectional view of a light emitting module according to other embodiment.

FIG. 6 is a schematic cross-sectional view of a light emitting module 2 according to another embodiment. Elements identical to those in the light emitting module 1 are denoted by identical reference characters, and the description thereof will not be repeated.

A fluorescent material layer 23 is provided at the bottom surface (the upper surface in FIG. 6) and the lateral surface of the recess 15 provided at the second main surface 12 of the light guide plate 10. The fluorescent material layer 23 may be made of a material identical to the above-described first fluorescent material layer 21 and/or second fluorescent material layer 22.

The light emitting element 30 is also provided in the recess 15, and bonded to the fluorescent material layer 23. A main light emitting surface 31 and the lateral surface of the light emitting element 30 are covered with the fluorescent material layer 23. The electrodes 32 of the light emitting element 30 are positioned outside the recess 15, and bonded to the wiring 71.

The difference from the light emitting module 1 lies in that no fluorescent material layer is provided at the second main surface 12 of the light guide plate 10. The second main surface 12 is provided with the light-reflective resin layer 60. The light-reflective resin layer 60 embeds the fluorescent material layer 23 and the light emitting element 30 on the second main surface 12 side.

The rest of the structure of the light emitting module 2 is identical to the light emitting module 1.

In the light emitting module 2 also, the light emitting element 30 is mounted on the light guide plate 10. This reduces the distance between the light guide plate 10 and the light emitting element 30, thereby reducing the thickness of the light emitting module 2. By virtue of the light emitting element 30 being provided in the recess 15, the thickness is reduced than in the light emitting module 1 shown in FIG. 2.

The fluorescent material layer 23 is provided not at the first main surface 11 which is the light emitting surface of the light guide plate 10, but on the second main surface 12 side opposite to the first main surface 11. Therefore, light having its wavelength converted by the fluorescent material layer 23 diffuses in the surface direction by the light guide plate 10 and the optical function part 40, minimizing any color unevenness in the surface of the light guide plate 10.

Furthermore, the fluorescent material layer 23 provided at the lateral surface of the recess 15 receives light emitted from the lateral surface of the light emitting element 30. Thus, light emitted by the fluorescent material and light emitted by the light emitting element 30 are distributed by a proper ratio over the entire surface of light guide plate 10. This minimizes any color unevenness in the surface of the light guide plate 10.

The light emitting module 2 achieves a further reduction in the use amount of the fluorescent material as compared to the light emitting module 1 shown in FIG. 2.

In the light emitting module 1 or the light emitting module 2, a plurality of recesses 15 may be provided for one light guide plate 10, to mount a plurality of light emitting elements 30 on one light guide plate 10.

Figure 7:
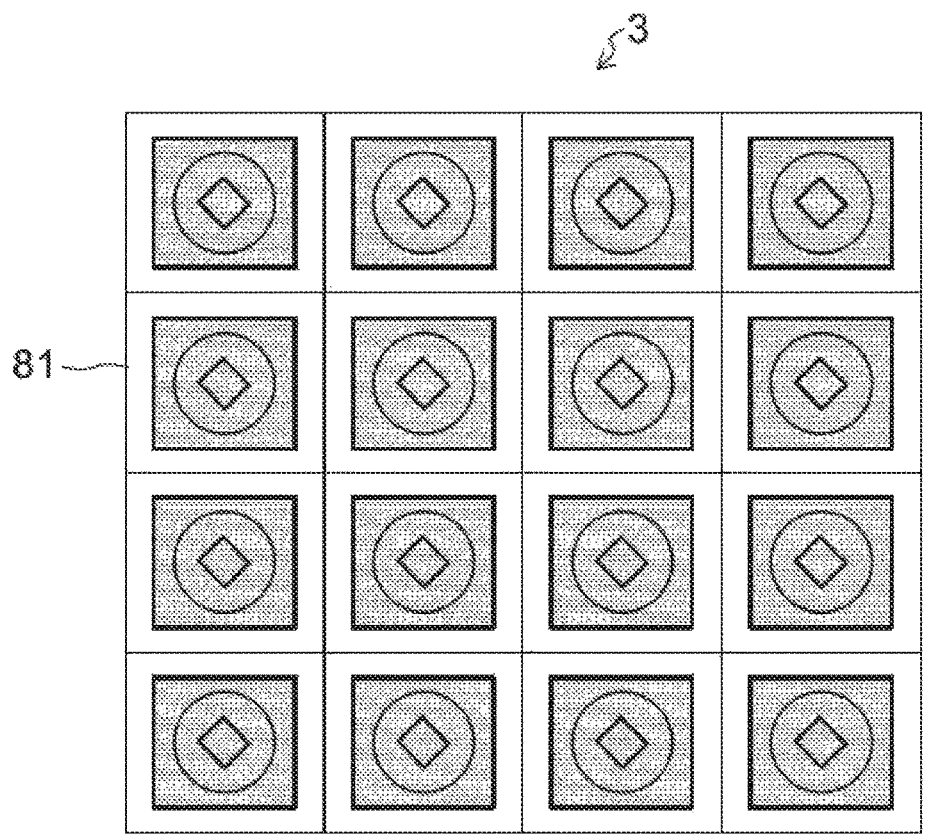
FIG. 7 is a schematic top view of a light emitting module according to another embodiment.

FIG. 7 is a schematic top view of a light emitting module 3 in which a plurality of recesses 15 is provided for one light guide plate 10, and a plurality of light emitting elements 30 is mounted.

Figure 8:
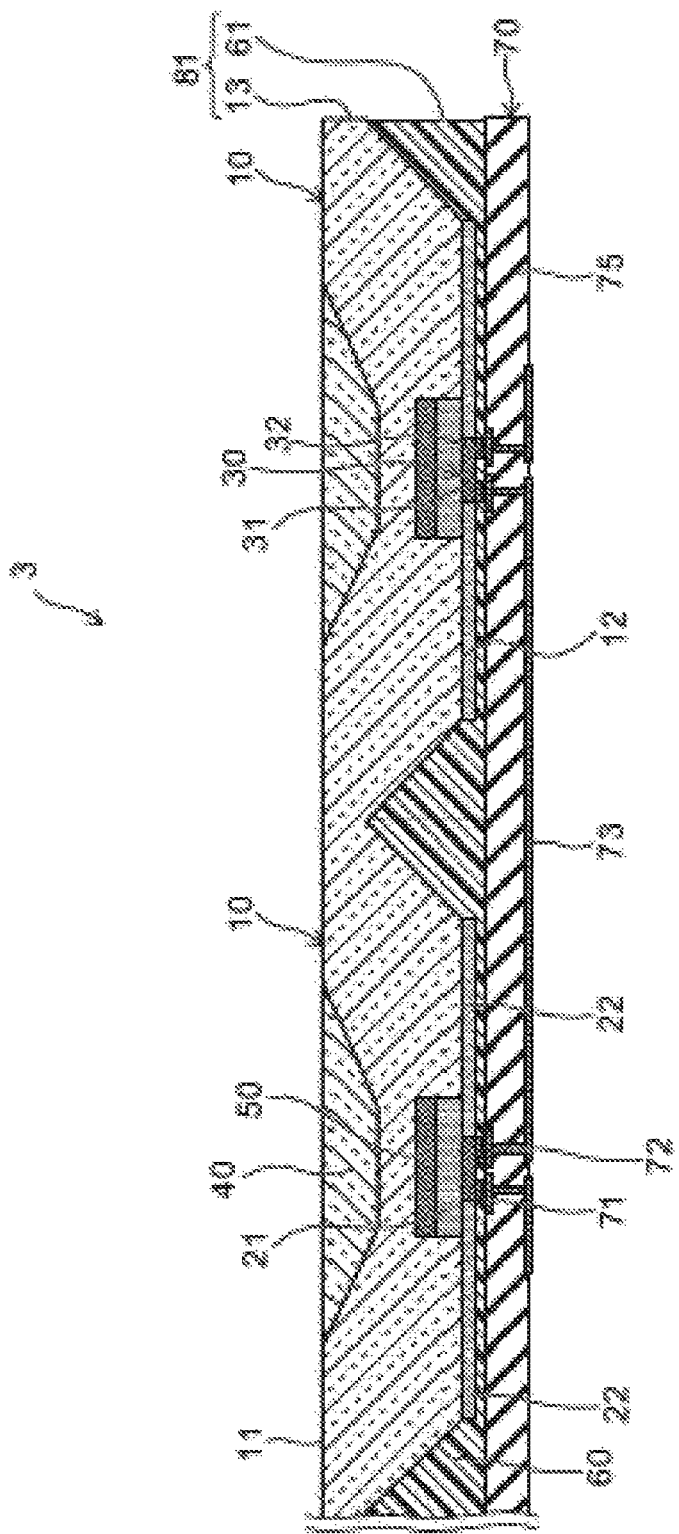
FIG. 8 is an enlarged partial schematic cross-sectional view of the light emitting module shown in FIG. 7.

FIG. 8 is an enlarged partial schematic cross-sectional view of the light emitting module 3.

In the light emitting module 3, a plurality of light emitting elements 30 is arranged, for example, in a matrix. The light emitting module 3 includes, between adjacent ones of the light emitting elements 30, the light-reflective part 61 formed of the light-reflective resin layer 60. By virtue of the light-transmissive part 13 being provided between adjacent ones of the light emitting elements 30 in the light emitting surface of the light emitting module 3, the portion between the light emitting elements 30 will not darken and even luminance and color are realized in the surface direction.

It is also possible to combine a plurality of light emitting modules 1 (or the light emitting modules 2) to obtain a planar light source having a greater light emitting area.

Figure 9:
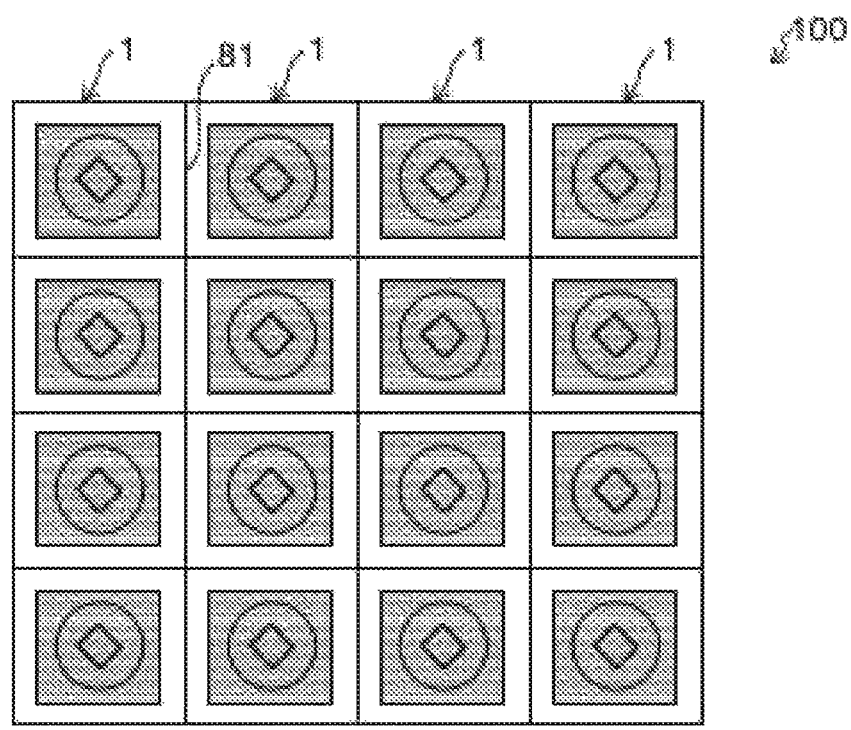
FIG. 9 is a schematic top view of a planar light source according to an embodiment.

FIG. 9 is a schematic top view of a planar light source 100 formed by a plurality of light emitting modules 1.

Figure 10:
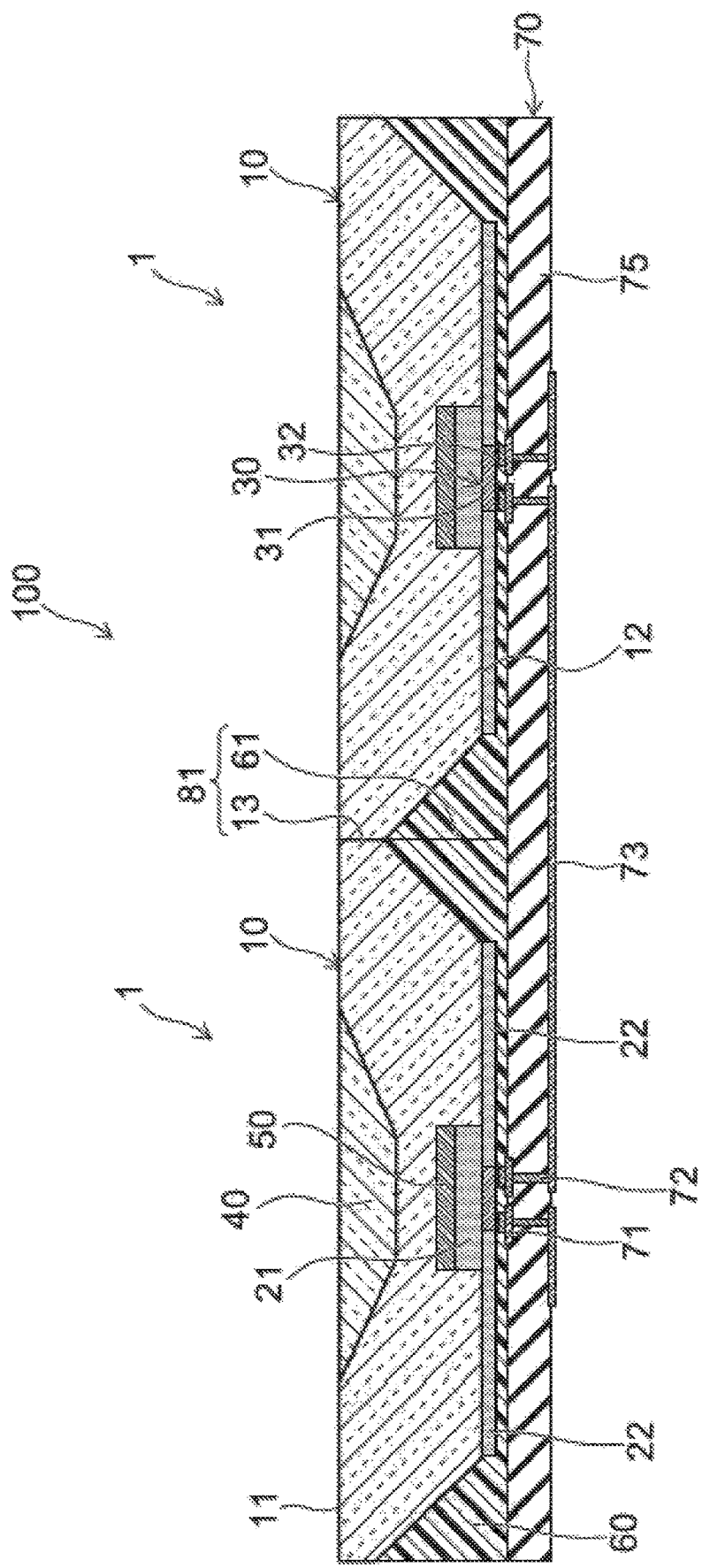
FIG. 10 is a schematic cross-sectional view of the planar light source according to the embodiment.

FIG. 10 is a schematic cross-sectional view of a portion in which two light emitting modules 1 are disposed adjacent to each other in the planar light source 100.

The planar light source may be formed having at least one lateral surface 81 of the light emitting module 1 bonded to the lateral surface 81 of another light emitting module 1. The plurality of light emitting modules 1 may form the planar light source having their respective lateral surfaces 81 arranged adjacent to each other, for example, in a matrix.

The light-reflective parts 61 of the lateral surfaces 81 are bonded to each other. On a side closer to the light emitting surface (first main surface 11) than the light-reflective parts 61, the light-transmissive parts 13 which are part of the light guide plate 10 are bonded to each other. By virtue of the light-transmissive parts 13 being provided at the boundary of the light emitting modules 1 adjacent to each other at the light emitting surface of the planar light source 100, the boundary will not darken and even luminance and color are realized in the surface direction.

Note that, the planar light source 100 may be formed of a plurality of light emitting modules 2, or a plurality of light emitting modules 3.

In the foregoing, the description has been given of the embodiments of the present disclosure with reference to specific examples. Note that, the present disclosure is not limited to these specific examples. Any mode that can be practiced by a person skilled in the art by changing the design based on the embodiments of the present disclosure belongs to the scope of the present disclosure so long as it covers the spirit of the present disclosure. In the scope of the idea of the present disclosure, a person skilled in the art will arrive at various changes and modifications, which are construed to belong to the scope of the present disclosure.

What is claimed is:

1. A light emitting module comprising:
   a light guide plate including a first main surface serving as a light emitting surface, and a second main surface provided on a side opposite to the first main surface;
   a light emitting element provided on the second main surface side of the light guide plate, the light emitting element having a main light emitting surface and a lateral surface;
   a fluorescent material layer covering the main light emitting surface and the lateral surface of the light emitting element; and
   a light-reflective resin layer provided on the second main surface, and positioned below the light emitting element and the fluorescent material layer.

2. The light emitting module according to claim 1, wherein the fluorescent material layer is in contact with the lateral surface of the light emitting element.

3. The light emitting module according to claim 1, wherein the main light emitting surface of the light emitting element is bonded to the fluorescent material layer.

4. The light emitting module according to claim 1, wherein the light-reflective resin layer embeds the fluorescent material layer and the light emitting element.

5. The light emitting module according to claim 1, further comprising an optical function part provided at the first main surface of the light guide plate at a position opposing to the light emitting element, the optical function part having a lower refractive index than the light guide plate.

6. The light emitting module according to claim 1, wherein the light guide plate includes an inclined surface continuous to the second main surface, and the inclined surface is covered with the light-reflective resin layer.

7. The light emitting module according to claim 1, wherein an electrode of the light emitting element is positioned outside the light guide plate.

8. A planar light source comprising a plurality of the light emitting modules according to claim 1 having their respective lateral surfaces arranged adjacent to each other.

9. The planar light source according to claim 8, wherein
in each of the lateral surfaces of the light emitting modules,
a light-reflective part is provided on the second main surface side of the light guide plate, and
the first main surface side of the light guide plate is part of the light guide plate.

10. The planar light source according to claim 8, further comprising a wiring board bonded to the light-reflective resin layer.

11. The light emitting module according to claim 1, wherein the light guide plate is positioned at a lateral side of the fluorescent material layer.

* * * * *